(12) United States Patent
Ko et al.

(10) Patent No.: US 7,879,629 B2
(45) Date of Patent: Feb. 1, 2011

(54) METHOD FOR MANUFACTURING FLOATING STRUCTURE OF MICROELECTROMECHANICAL SYSTEM

(75) Inventors: Sang-Choon Ko, Daejon (KR); Chi-Hoon Jun, Daejon (KR); Hyeon-Bong Pyo, Daejon (KR); Seon-Hee Park, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 396 days.

(21) Appl. No.: 11/927,810

(22) Filed: Oct. 30, 2007

(65) Prior Publication Data
US 2008/0233752 A1 Sep. 25, 2008

(30) Foreign Application Priority Data
Dec. 6, 2006 (KR) .................. 10-2006-0123293

(51) Int. Cl.
H01L 21/00 (2006.01)
H01L 21/311 (2006.01)

(52) U.S. Cl. .................. 438/26; 438/51; 438/55; 438/64; 438/700; 257/E31.11

(58) Field of Classification Search .............. 438/700, 438/26, 51, 55, 64; 257/17
See application file for complete search history.

(56) References Cited

U.S. PATENT DOCUMENTS

| | | | |
|---|---|---|---|
| 6,111,280 A | 8/2000 | Gardner et al. | |
| 6,140,689 A | 10/2000 | Scheiter et al. | |
| 6,732,415 B2 * | 5/2004 | Nakatani et al. | 29/25.35 |
| 6,842,088 B2 * | 1/2005 | Yamada et al. | 333/187 |
| 7,333,679 B2 * | 2/2008 | Takahashi | 385/1 |
| 2002/0084499 A1 * | 7/2002 | Lin et al. | 257/415 |
| 2002/0189062 A1 * | 12/2002 | Lin et al. | 29/25.35 |
| 2004/0026755 A1 * | 2/2004 | Kim | 257/414 |
| 2004/0223884 A1 * | 11/2004 | Chen et al. | 422/88 |
| 2005/0106318 A1 * | 5/2005 | Partridge et al. | 427/248.1 |
| 2007/0045756 A1 * | 3/2007 | Chang et al. | 257/414 |

FOREIGN PATENT DOCUMENTS

| | | |
|---|---|---|
| JP | 11-220135 | 8/1999 |
| JP | 11220135 | * 8/1999 |
| KR | 1020010084924 | 9/2001 |

(Continued)

OTHER PUBLICATIONS

Yaowu Mo et al; "Micro-machined gas sensor array based on metal film micro-heater;" (Sensors and Actuators, B9 pp. 175-181, 2001).

(Continued)

Primary Examiner—David A Zarneke
(74) Attorney, Agent, or Firm—Ladas & Parry LLP (57) ABSTRACT

Provided is a method for manufacturing a floating structure of a MEMS. The method for manufacturing a floating structure of a microelectromechanical system (MEMS), comprising the steps of: a) forming a sacrificial layer including a thin layer pattern doped with impurities on a substrate; b) forming a support layer on the sacrificial layer; c) forming a structure to be floated on the support layer by using a subsequent process; d) forming an etch hole exposing both side portions of the thin layer pattern; and e) removing the sacrificial layer through the etch hole to form an air gap between the support layer and the substrate.

15 Claims, 8 Drawing Sheets

FOREIGN PATENT DOCUMENTS

KR    1020020016890    3/2002

OTHER PUBLICATIONS

Philip C.H. Chan et al; "An integrated gas sensor technology using surface micro-machining;" (Sensors and Actuators, B82, pp. 277-283, 2002).

Diego Barrettino et al; "CMOS Monolithic Metal-Oxide Gas Sensor Microsystems;"(IEEE Sensors Journal, vol. 6, No. 2, pp. 276-286, Apr. 2006).

M Brauer et al; "Silicon microphone based on surface and bulk micromaching;" (Journal of Micromechanics and Microengineering, vol. 11, pp. 319-322, 2001).

* cited by examiner

METHOD FOR MANUFACTURING FLOATING STRUCTURE OF MICROELECTROMECHANICAL SYSTEM

CROSS-REFERENCE(S) TO RELATED APPLICATIONS

The present invention claims priority of Korean Patent Application No. 10-2006-0123293, filed on Dec. 6, 2006, which is incorporated herein by reference.

BACKGROUND OF THE INVENTION

1. Field of the Invention

The present invention relates to a microelectromechanical system (MEMS); and, more particularly, to a method for manufacturing a floating structure of a MEMS.

This work was supported by the IT R&D program of MIC/IITA [2006-S-007-01, "Ubiquitous Health Monitoring Module and System Development"].

2. Description of Related Art

In general, a MEMS manufacturing technology is based on a semiconductor manufacturing technology. Well-know MEMS manufacturing technologies include a surface micromachining MEMS manufacturing technology, and a bulk micromachining MEMS manufacturing technology. In those technologies, a process of removing a sacrificial oxide layer is commonly used to float a structure of a specific part. Also, when a structure with a deep trench is formed, an anisotropic wet etching process used in the bulk micromachining MEMS manufacturing technology is generally used.

As one of methods of floating a structure by using a sacrificial oxide layer, a sacrificial layer pattern under a structure to be floated is separately defined and then etched to float the structure. As another method, isotropic etching is performed through an etching window by using a phosphosilicate glass layer as a sacrificial layer to float a polysilicon structure. The phosphosilicate glass layer has a higher etch rate than a silicon oxide ($SiO_2$) layer, and is formed using low-pressure chemical vapor deposition (LPCVD).

As mentioned above, in the methods of floating a structure using a sacrificial oxide layer, a polysilicon pattern is formed on a silicon oxide layer used as a sacrificial layer, and then the silicon oxide layer, i.e., the sacrificial layer is removed by using a fluoric acid (HF)-based etching solution having high selectivity between the silicon oxide layer and the polysilicon pattern, thereby floating the structure formed of the polysilicon pattern or ensuring a required space under the polysilicon pattern.

Besides a structure partially floated in the sacrificial layer etching process, the sacrificial layer under the floating structure, which serves as a floating structure anchor part is also etched simultaneously at the same rate. Accordingly, the size of the sacrificial layer corresponding to the floating-structure anchor portion is designed to be greater than a pattern area of the structure to be floated, so that the floating structure is mounted on a substrate.

However, in the conventional method of manufacturing a floating structure, a surface of a doped polysilicon layer is damaged while the sacrificial layer is etched by the HF-based etching solution. Particularly, to form a polysilicon structure with a large area, the sacrificial layer is etched such that side etching is performed symmetrically with respect to an etching start position.

For this reason, if process time for etching the sacrificial layer increases, a portion of the polysilicon layer close to the etching start position contacts the HF-based etching solution for a longer period of time, as compared to a portion of the polysilicon layer at an etching end position. This damages the thin doped-polysilicon structure.

To manufacture a floating structure with a deep trench, an anisotropic wet etching process is generally performed to form a trench in a substrate. In this case, the trench forming process may take a long time because of variations in etching rate of a silicon substrate. That is, the long-time trench forming process is caused because an etching rate is significantly small at a side portion of the silicon substrate as compared to an etching rate at another portion of the silicon substrate in a depth direction.

Therefore, an etching process must be performed for a sufficiently long time to form a trench with a desired depth and width, which lengthens process time.

SUMMARY OF THE INVENTION

An embodiment of the present invention is directed to providing a method for manufacturing a floating structure of MEMS, which is adapted to stably form a floating structure by preventing the floating structure from being damaged by an etching solution in a process of etching a sacrificial layer.

Another embodiment of the present invention is directed to providing a method for manufacturing a floating structure of MEMS, which is adapted to reduce a manufacturing process.

In accordance with an aspect of the present invention, there is provided a method for manufacturing a floating structure of a microelectromechanical system (MEMS), comprising the steps of: a) forming a sacrificial layer including a thin layer pattern doped with impurities on a substrate; b) forming a support layer on the sacrificial layer; c) forming a structure to be floated on the support layer by using a subsequent process; d) forming an etch hole exposing both side portions of the thin layer pattern; and e) removing the sacrificial layer through the etch hole to form an air gap between the support layer and the substrate.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

The advantages, features and aspects of the invention will become apparent from the following description of the embodiments with reference to the accompanying drawings, which is set forth hereinafter. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Like reference numerals refer to like elements throughout.

FIGS. 1 to 15 are cross-sectional views sequentially showing a manufacturing process to explain a method for manufacturing a floating structure of a MEMS in accordance with an embodiment of the present invention. A method for manufacturing a floating structure with a deep cavity will now be described as an example.

Figure 1:
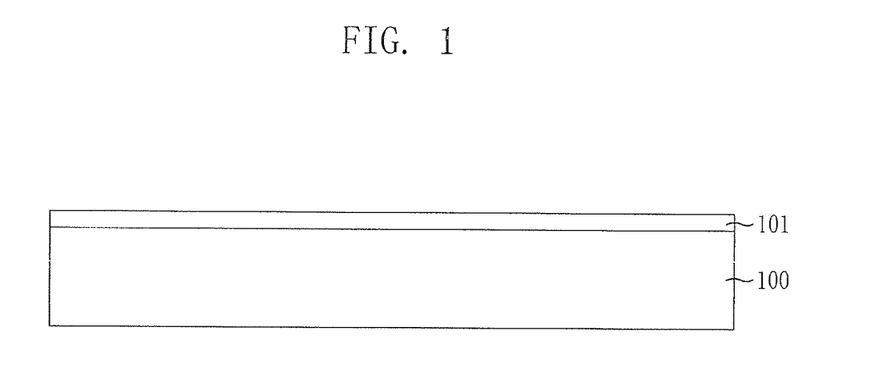
FIGS. 1 to 15 are cross-sectional views for explaining a method for manufacturing a floating structure of a MEMS in accordance with an embodiment of the present invention.

Referring to FIG. 1, a low temperature oxide (LTO) layer 101 (hereinafter, referred to as a first oxide layer) that is to be used as a lower layer of a sacrificial layer is formed on a silicon substrate 100. The first oxide layer 101 is formed by a wet oxidation process, a dry oxidation process, or a radical oxidation process. Alternatively, the first oxide layer 101 may be formed by chemical vapor deposition (CVD).

Figure 2:
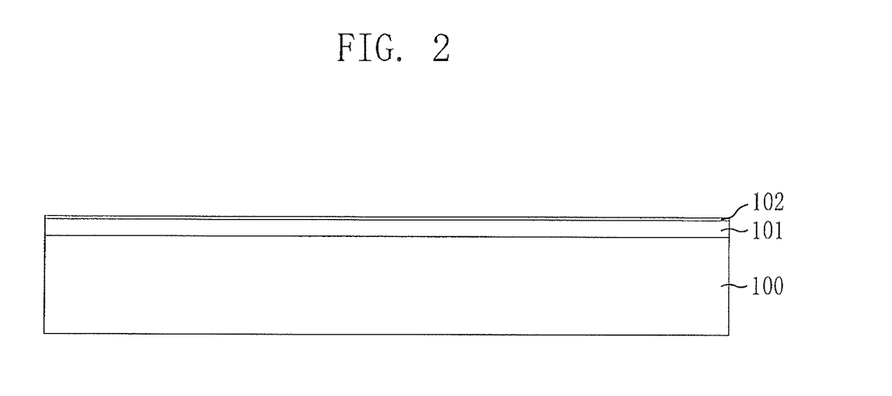

Referring to FIG. 2, an impurity layer that is to be used as a middle layer of the sacrificial layer is formed in the first oxide layer 101. The impurity layer 102 is formed with a predetermined depth from a top surface of the first oxide layer 101. For example, the impurity layer 102 is formed with a relatively thin thickness of approximately hundreds of angstroms, preferably, a thickness ranging from approximately 100 Å to approximately 900 Å. The impurity layer 102 is formed of $P_2O_5$ or $B_2O_3$.

For example, a manufacturing method in the case of forming the impurity layer 102 of $P_2O_5$ will now be described. A substrate 100 is heated to a temperature of approximately 950° C. using a heat treatment process in a state where the top surface of the first oxide layer 101 is exposed. A doping process using $POCl_3$ is performed in an $O_2$ atmosphere for about 30 minutes to form a $P_2O_5$ layer with a relatively thin thickness of hundreds of angstroms in the surface of the first oxide layer 101. The surface of the first oxide layer 101 contacting the $P_2O_5$ layer is highly doped with phosphorus (P)

If the impurity layer 102 is formed of $B_2O_3$, a doping process using, for example, $BBr_3$ is performed. In this case, the surface of the first oxide layer 101 contacting the $B_2O_3$ layer is highly doped with boron (B). Alternatively, a boron nitride (BN) wafer, which is a solid type wafer source, is oxidized to form the $B_2O_3$ layer in the surface of the first oxide layer 101.

Figure 3:
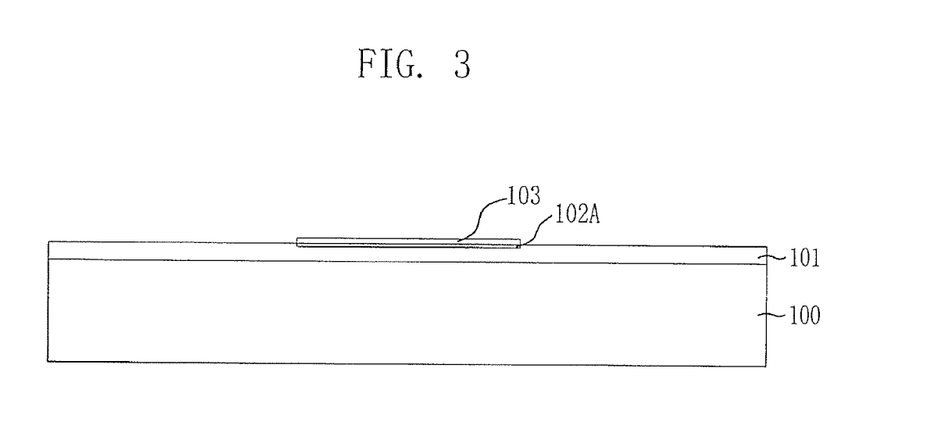

Referring to FIG. 3, a photoresist layer is applied on the impurity layer 102, and then exposure and development processes (hereinafter, referred to as a photo process) using a photo mask are sequentially performed to form a photoresist pattern 103. The photoresist pattern 103 is formed only at a region where a cavity is to be formed using a subsequent process, and is not formed at another region.

An etching process is performed by using the photoresist pattern 103 as an etch mask to etch and remove the impurity layer 102 which is not covered with the photoresist pattern 103. The etching process may be a wet etching process. For example, the substrate 100 including the impurity layer 102 is dipped in a solution prepared by diluting an HF solution with deionized water (DI) at a ratio of DI:HF=10:1 for about 10 seconds to about 15 seconds.

In this process, the doped impurity layer 102 is etched at an etch ratio higher than that of the un-doped first oxide layer 101 by approximately 20 times to approximately 30 times. The impurity layer 102 and the surface layer highly doped with phosphorus (P) or boron (B) of the first oxide layer 101 are etched in a region which is not covered with the photoresist pattern 103, thereby forming an impurity layer pattern 102A.

Figure 4:
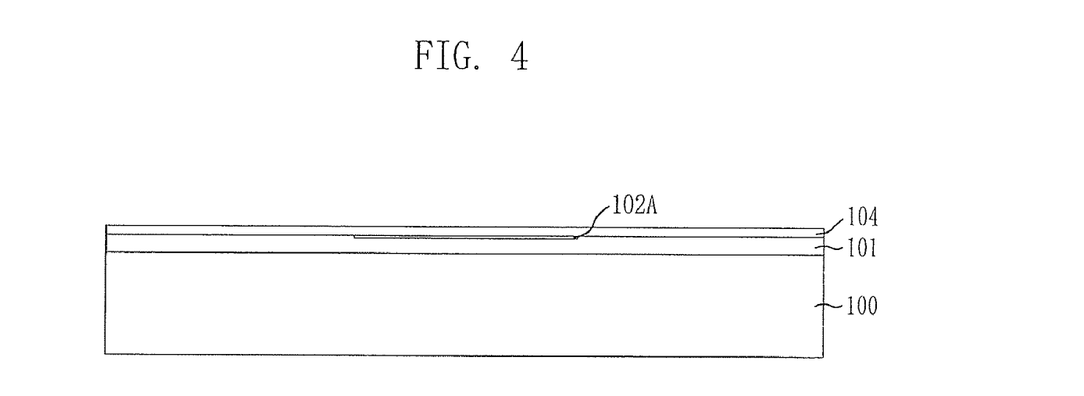

Referring to FIG. 4, a strip process is performed to remove the photoresist pattern 103.

To remove a natural oxide layer and other foreign substances, a washing process may be performed.

Thereafter, an oxide layer 104 (hereinafter, referred to as a second oxide layer) to be used as an upper layer of the sacrificial layer is formed to cover the impurity layer pattern 102A.

The second oxide layer 104 may be formed of silicon oxide, boron phosphorus silicate glass, (BPSG), phosphorus silicate glass (PSG), tetra ethyl ortho silicate (TEOS), un-doped silicate glass (USG), spin on glass (SOG), high density plasma (HDP), or spin on dielectric (SOD).

Figure 5:
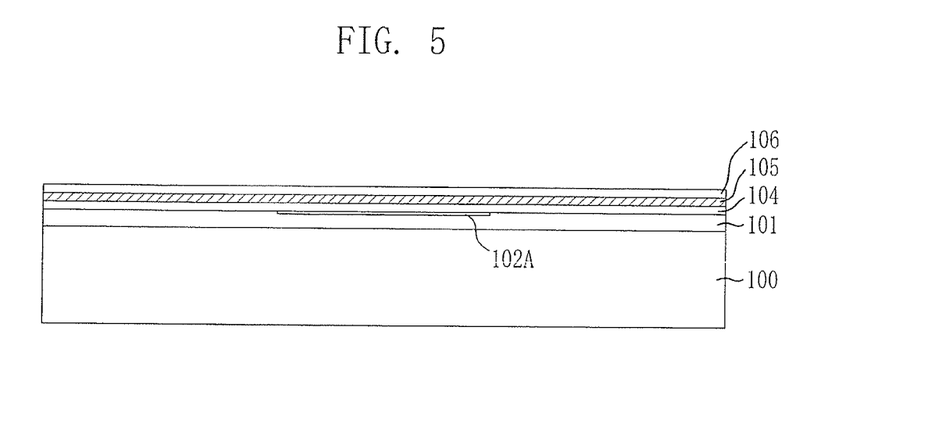

Referring to FIG. 5, a nitride layer 105 for a support layer (hereinafter, referred to as a first nitride layer) is formed on the second oxide layer 104. The first nitride layer 105 may be formed of silicon nitride.

Thereafter, an oxide layer 106 (hereinafter, referred to as a third oxide layer) is formed on the first nitride layer 105. The third oxide layer 106 is formed of the same material by the same method as the second oxide layer 104.

Figure 6:
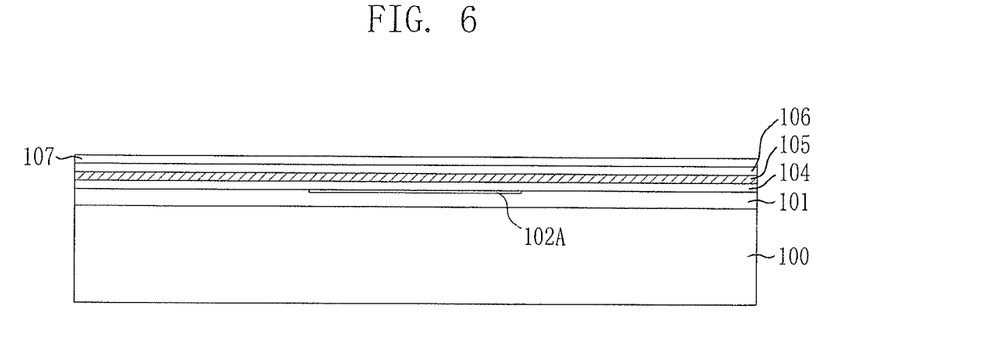

Referring to FIG. 6, an impurity-doped polysilicon layer 107 serving as a resistor is formed on the third oxide layer 106. If a p-type polysilicon layer 107 is formed, silane ($SiH_4$) and a phosphorus-containing compound, e.g., $PCl_5$ or $PH_3$ are used. If an n-type polysilicon layer 107 is formed, silane and a boron-containing compound, e.g., $BCl_3$ or B2H6 are used.

When an MEMS is a micro gas sensor, the doped polysilicon layer 107 acts as a micro heater. Instead of the doped polysilicon layer 107, a platinum layer or a stacked structure including at least platinum may be formed, and besides, a layer of transition metal, rare earth metal, or a conductive compound may be formed.

For example, examples of the transition metal that can be used include iron (Fe), cobalt (Co), tungsten (W), nickel (Ni), palladium (Pd), platinum (Pt), molybdenum (Mo) and titanium (Ti). Examples of the rare earth metal that can be used include erbium (Er), yitterbium (Yb), samarium (Sm), yttrium (Y), lanthanum (La), cerium (Ce), terbium (Tb), dysprosium (Dy), holmium (Ho), thulium (Tm), and lutetium (Lu) Examples of the conductive compound that can be used include zinc oxide (ZnO), tin oxide ($SnO_2$), indium tin oxide (ITO), and gallium nitride (GaN).

Figure 7:
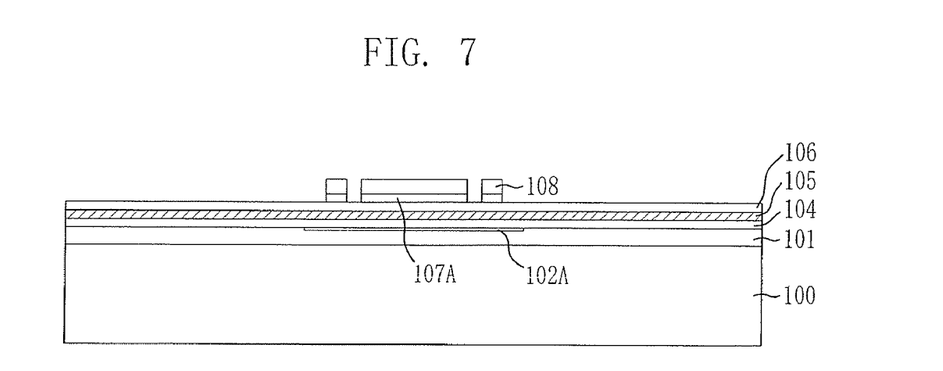

Referring to FIG. 7. a photo process is performed to form a photoresist pattern 108 on the doped polysilicon layer 107.

Thereafter, a dry etching process is performed by using the photoresist pattern 108 as an etch mask to etch the doped polysilicon layer 107, thereby forming a polysilicon layer pattern 107A.

Figure 8:
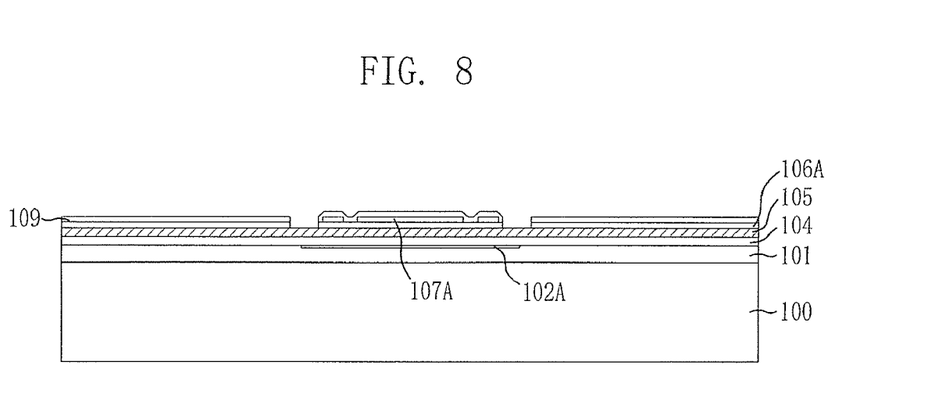

Referring to FIG. 8, a strip process is performed to remove the photoresist pattern 108.

Thereafter, a washing process and a dry process may be performed.

Thereafter, an oxide layer (hereinafter, referred to as a fourth oxide layer) is deposited to cover the polysilicon layer pattern 107A. Thereafter, a dry etching process is performed by using a photoresist pattern (not shown) formed using a photo process to etch the fourth oxide layer and the third oxide layer 106 corresponding to a portion where an etch hole for cavity formation is to be formed. Thus, a third oxide layer pattern 106A and a fourth oxide layer pattern 109 are formed. A portion of the fourth oxide layer pattern 109 covers the polysilicon layer pattern 107A.

Then, the photoresist pattern is removed.

Thereafter, a washing process and a dry process may be performed.

Figure 9:
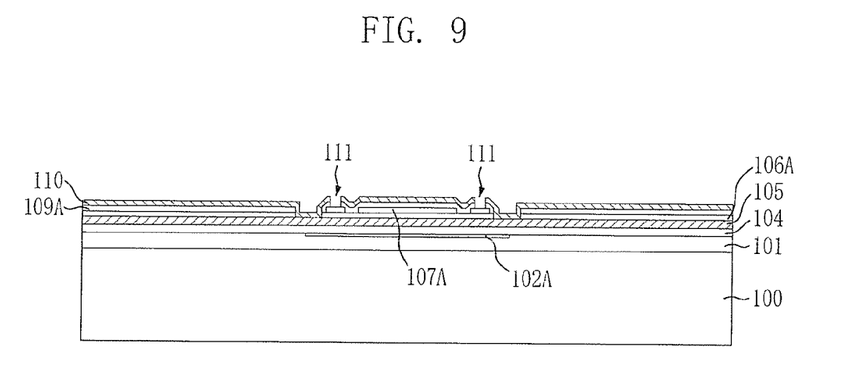

Referring to FIG. 9, a nitride layer (hereinafter, referred to as a second nitride layer) is formed along a height difference of a top surface of the substrate including the fourth oxide layer pattern 109, and then a dry etching process using a photoresist pattern (not shown) formed using a photo process is performed, thereby etching the second nitride layer and the fourth oxide layer pattern 109.

Thus, contact holes 111 exposing a portion of the polysilicon layer pattern 107A are formed. For the convenience in description, reference numeral 109A will be referred to as a fourth oxide layer pattern, and 110 will be referred to as a second nitride layer pattern.

Then, the photoresist pattern is removed.

Figure 10:
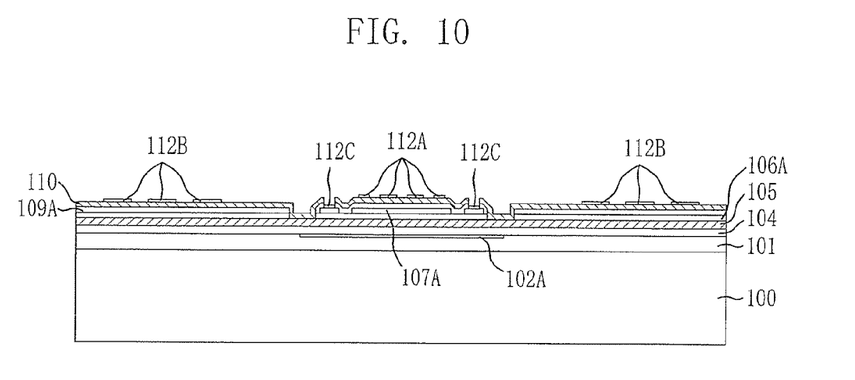

Thereafter, a washing process and a dry process may be performed,

Referring to FIG. 10, electrodes 112A and pads 112B are formed on the second nitride layer pattern 110. The electrode 112A and the pad 112B are formed of platinum or as a stack structure including platinum. Besides, all the conductive materials can be used for the electrode 112A and the pad 112B. The electrode 112A and the pad 112B may not be simultaneously formed, but be formed using separate processes. Also, some pads 112B are formed on the polysilicon layer pattern 107A. The pads 112B and 112C are connected to an external line.

The electrodes 112A and the pads 112B are integrally formed, and those are separated from the pads 112C.

Figure 11:
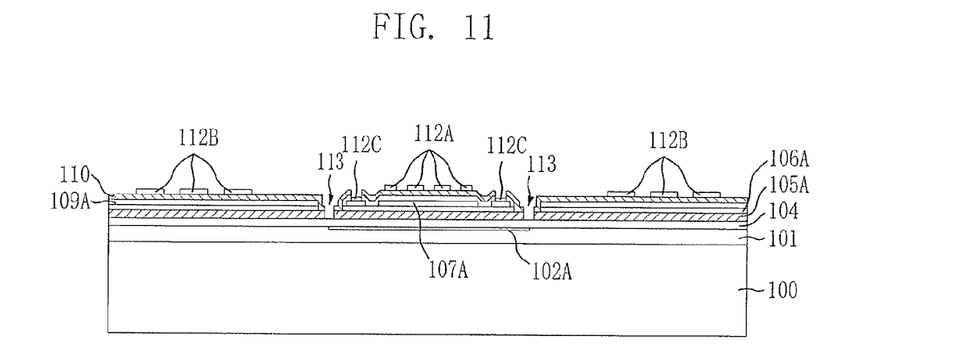

Referring to FIG. 11, an etching process using a photoresist pattern (not shown) formed using a photo process is performed to etch the second nitride layer pattern 110 and the first nitride layer 105. Etch grooves 113 into which an etching solution is introduced in an etching process are formed for cavity formation. Reference numeral 105A indicates a first nitride layer pattern. Thereafter, the photoresist pattern is removed. Then, a washing process and a dry process may be performed.

Figure 12:
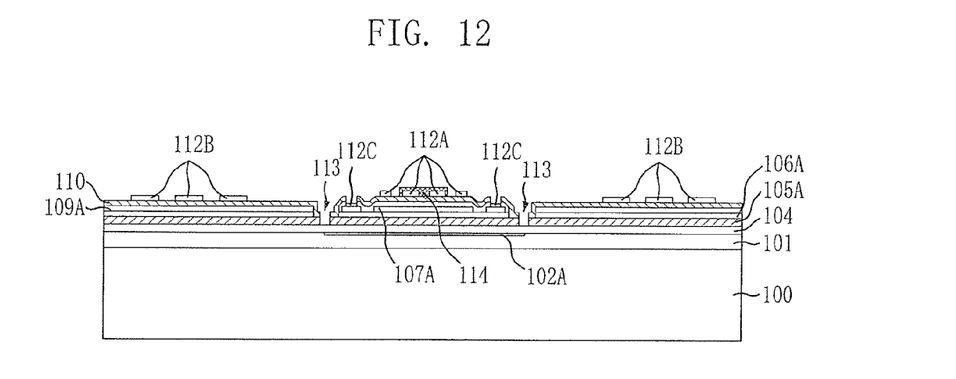

Referring to FIG. 12, a sensing layer 114 is formed to cover the electrode 112A. The sensing layer 114 is formed using a lift-off process. In the lift-off process, a photoresist pattern exposing a region where the sensing layer 114 is to be formed is formed, a material for a sensing layer is deposited thereon, and then the photoresist pattern is removed.

If the MEMS is a micro gas sensor, the sensing layer 114 acts as a gas reactive layer. In this case, metal, a semiconductor, or metal oxide may be used as a material of the sensing layer 114. For example, the metal layer is formed of at least one selected from the group consisting of cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), nickel (Ni), titanium (Ti), cobalt (Co), copper (Cu), platinum (Pt), tungsten (W), gold (Au), silver (Ag), zinc (Zn), iridium (Ir), tantalum (Ta), hafnium (Hf), potassium (K), lithium (Li), cesium (Cs), and an alloy thereof. The metal oxide may be $SnO_2$, $ZnO$, $WO_3$, $In_2O_3$, $Ga_2O_3$, $Fe_2O_3$, $TiO_2$, $NiO$, or $MoO_3$. Also, the sensing layer may be formed of the aforementioned metal oxide doped with impurities.

Figure 13:
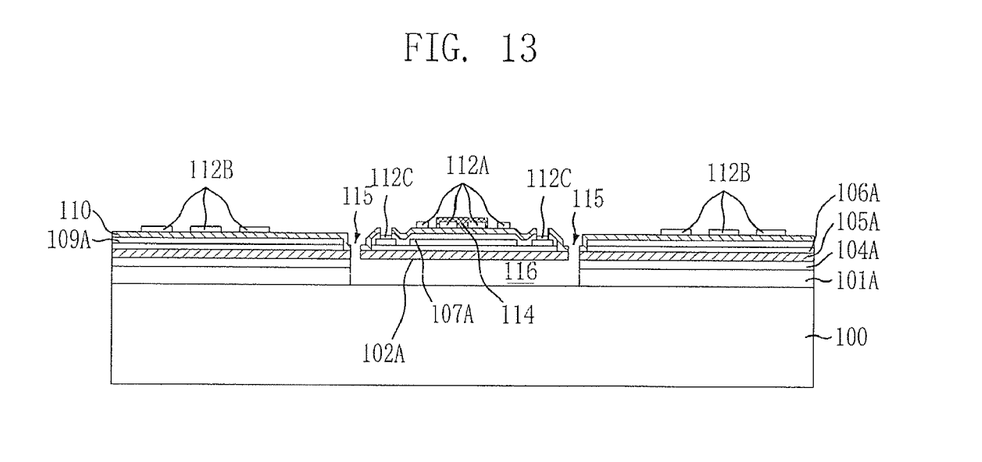

Referring to FIG. 13, after a photoresist pattern (not shown) exposing the etch groove 113 is formed using a photo process, a wet etching process using the photoresist pattern is performed to remove the first and second oxide layers 101 and 104, and the impurity layer pattern 102A.

As the impurity layer pattern 102A embedded in a boundary between the first and second oxide layers 101 and 104, and the surface layer of the first oxide layer 101 are rapidly etched because of a high etch rate, a micro channel is formed in a side direction, i.e., an extension direction of the impurity layer pattern 102A. Then, etching of the first and second oxide layers 101 and 104 is induced above and under the micro channel by introducing an oxide-layer etching solution, e.g., a HF solution into the micro channel.

Accordingly, only the sacrificial layer within a predefined specific space can be rapidly and selectively removed. The etching solution is introduced through the etch holes 115, leaving a membrane floating structure with an air gap 116.

Reference numeral 101A is a first oxide layer pattern, and 104A is a second oxide layer pattern.

Figure 14:
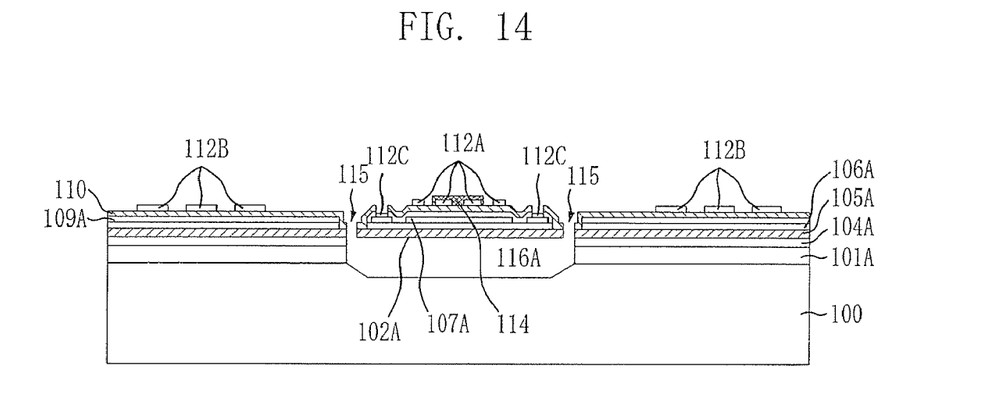

Referring to FIG. 14, an anisotropic wet etching process is performed through the air gap 116, so that silicon at an entire region defining the air gap 116 is simultaneously etched in a depth direction of the substrate 100. A floating member with a deeper air gap 116A is formed.

Figure 15:
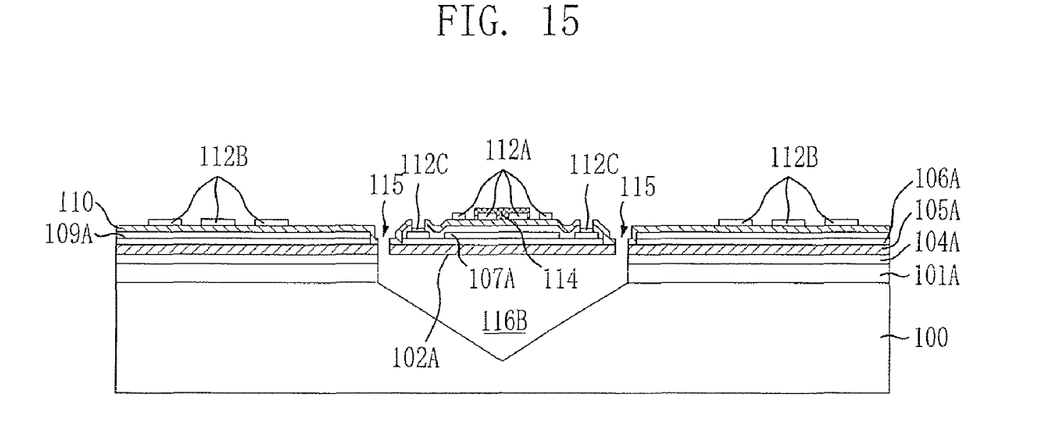

Referring to FIG. 15, an anisotropic wet etching process of FIG. 14 is continuously performed, thereby forming a cavity 116B having a width decreasing downwardly.

In the anisotropic wet etching process of FIGS. 14 and 15, direct etching is performed in a depth direction, unlike the related art in which a side etching process is performed only through an etch groove. Therefore, the ratio of an etch rate in the side direction to an etch rate in a depth direction becomes 1:10 to N where N is a natural number of 11 or greater. Thus, the cavity 116B can be formed rapidly, and therefore, a process time can be reduced. Also, a depth of the cavity 116B can be adjusted to a desired extent using the anisotropic wet etching process.

In FIGS. 1 to 15, layers are formed only on a top surface of the substrate 100 for the convenience in description. However, in actuality, predetermined layers may be formed on a back surface of the substrate 100. In this case, the layers on the back surface are removed using separate etching and washing processes.

The method for forming a membrane floating structure has been described through FIGS. 1 to 15 in accordance with the embodiment of the present invention. However, the floating structure may be formed into, e.g., a cantilever type, or a bridge type. The present invention is also applicable to floating a specific structure over a substrate by using a sacrificial layer in manufacturing a stacked type sensor or an actuator structure in a MEMS field, or to forming a micro cavity structure or an inlet of the air or other substances.

In the embodiment of the present invention, the case where the floating structure is formed of polysilicon has been described. However, the present invention is not limited thereto, and is also applicable in the same manner to forming a floating structure of a metal material or a non-metal material such as plastic.

In accordance with an embodiment of the present invention, a sacrificial layer is doped with impurities, and then is isotropically etched primarily through an etch hole by using a HF solution. Because of a high etch rate of the impurity layer, a micro channel can be formed, and thus, a thick oxide layer can be selectively etched.

In accordance with an embodiment of the present invention, only a sacrificial layer can be selectively etched, thereby minimizing etching of a sacrificial layer at a portion, which is not a predetermined target to be removed.

In accordance with an embodiment of the present invention, a process is performed only on a top surface of the substrate without performing a process on a back surface of the substrate, which can obviate limitations that may be caused by the back-surface process.

In accordance with an embodiment of the present invention, a silicon substrate under a floating structure is etched using an anisotropy wet etching process to form a cavity, so that a depth of the cavity can be freely adjusted.

In accordance with an embodiment of the present invention, the sacrificial layer is removed to form an etch passage exposing an entire region of the substrate where a cavity is to be formed. In this state, the substrate is etched at a higher etch rate in a depth direction than in a side direction of the cavity. Therefore, a process time can be reduced.

In accordance with an embodiment of the present invention, because the sacrificial layer that is easily etched by an etching solution is used, the present invention is also applicable to a structure manufacturing process of a stacked type sensor and actuator in a MEMS field, thereby improving efficiency.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a floating structure of a microelectromechanical system (MEMS), comprising the steps of:
   a) forming a sacrificial layer including a thin layer pattern doped with impurities on a substrate, the sacrificial layer having a top surface and a side surface;
   b) forming a support layer on the sacrificial layer;
   c) forming a structure to be floated on the support layer by using a subsequent process;
   d) forming an etch hole exposing the side surface of the thin layer pattern;
   e) removing the sacrificial layer through the etch hole to form an air gap between the support layer and the substrate; and
   f) etching the substrate exposed through the air gap to form a cavity in the substrate after the step e), wherein the etching is performed by an anisotropic wet etching process.

2. The method of claim 1, wherein the step a) includes the steps of:
   a1) forming a first oxide layer on the substrate;
   a2) forming the thin layer pattern on the first oxide layer; and
   a3) forming a second oxide layer on the substrate including the thin layer pattern.

3. The method of claim 2, wherein the step a2) includes the steps of:
   a2-1) doping a part of an upper portion of the first oxide layer with impurities; and
   a2-2) etching the first oxide layer such that both side portions of the doped first oxide layer correspond to the etch hole.

4. The method of claim 3, wherein the step a2-1) is performed by a doping process using $BBr_3$.

5. The method of claim 1, wherein the impurities are phosphorus (P) or boron (B) ions.

6. The method of claim 1, wherein the thin layer pattern is formed of $P_2O_5$ or $B_2O_3$.

7. The method of claim 1, wherein the support layer is formed of nitride.

8. The method of claim 1, wherein the step e) is performed by an isotropic wet etching process.

9. The method of claim 8, wherein the isotropic wet etching process is performed by introducing a solution through the etch hole, the solution being prepared by diluting a fluoric acid (HF) solution with deionized water.

10. The method of claim 9, wherein the solution is prepared by diluting the HF solution with the deionized water at a ratio of at least approximately 1:10.

11. The method of claim 1, wherein the step c) includes the steps of:
    c1) forming a first conductive layer on the support layer;
    c2) forming a first insulating layer to cover the conductive layer, the first insulating layer exposing the etch hole;
    c3) forming a second insulating layer to cover the first insulating layer; and
    c4) forming a second conductive layer on the second insulating layer, corresponding to the first conductive layer.

12. The method of claim 11, wherein the etch hole is formed by etching the second insulating layer.

13. The method of claim 11, further comprising the step of:
    c5) forming a sensing layer to cover the second conductive layer after the step c4).

14. The method of claim 1, wherein the etch hole is formed in plurality.

15. The method of claim 1, wherein the structure is formed into a membrane type, a cantilever type, or a bridge type.

* * * * *